United States Patent [19]

Andrews et al.

[11] Patent Number: 5,324,387
[45] Date of Patent: Jun. 28, 1994

[54] METHOD OF FABRICATING ASYMMETRIC CLOSELY-SPACED MULTIPLE DIODE LASERS

[75] Inventors: John R. Andrews, Fairport, N.Y.; George A. Neville Connell, Cupertino, Calif.

[73] Assignee: Xerox Corporation, Stamford, Conn.

[21] Appl. No.: 57,798

[22] Filed: May 7, 1993

[51] Int. Cl.$^5$ .................... H01L 21/306; H01L 21/60
[52] U.S. Cl. .................... 156/630; 437/209; 437/902; 437/906; 148/DIG. 95
[58] Field of Search ............ 156/630; 437/209, 902, 437/906; 148/DIG. 95; 372/36; 257/81, 99

[56] References Cited

U.S. PATENT DOCUMENTS

| | | | |
|---|---|---|---|
| 3,634,160 | 1/1972 | van Esdonk et al. | 156/630 |
| 4,160,308 | 7/1979 | Courtney et al. | 437/906 |
| 4,360,965 | 11/1982 | Fujiwara | 437/902 |
| 4,403,243 | 9/1983 | Hakamada | 357/74 |
| 4,672,737 | 6/1987 | Carson et al. | 437/209 |
| 4,796,964 | 1/1989 | Connell et al. | 350/6.8 |
| 4,855,809 | 8/1989 | Malhi et al. | 437/209 |
| 4,870,652 | 9/1989 | Thornton | 372/50 |
| 4,901,325 | 2/1990 | Kato et al. | 372/44 |
| 5,099,488 | 3/1992 | Ahrabi et al. | 372/36 |

FOREIGN PATENT DOCUMENTS

| | | | |
|---|---|---|---|
| 281900 | 9/1988 | European Pat. Off. | 437/209 |
| 155790 | 9/1982 | Japan | 372/36 |
| 122157 | 5/1988 | Japan | 437/209 |
| 2050896 | 1/1981 | United Kingdom | 372/36 |

*Primary Examiner*—R. Bruce Breneman
*Assistant Examiner*—Linda J. Fleck
*Attorney, Agent, or Firm*—Duane C. Basch

[57] ABSTRACT

The present invention is a method for fabricating a multiple beam semiconductor laser, wherein the laser includes first and second semiconductor laser dies respectively affixed to a pair of supporting heatsinks. The method utilizes a laminating process to accurately position the supporting heatsinks relative to one another yet on opposite sides of an intermediate spacer to form a sandwich-like element. After permanently affixing the sandwich-like element to a base plate, the intermediate spacer is dissolved or otherwise removed to expose the mounting surfaces for the laser dies. The method not only enables the accurate placement of the heatsinks relative to one another so as to reduce the positional error, but also eliminates the need for subsequent multiple-step laser beam alignment operations.

13 Claims, 4 Drawing Sheets

METHOD OF FABRICATING ASYMMETRIC CLOSELY-SPACED MULTIPLE DIODE LASERS

This invention relates generally to a semiconductor laser device, and more particularly to a method for fabricating a multiple diode laser from a plurality of semiconductor laser chips which are closely spaced yet thermally, electrically and optically isolated from one another.

CROSS REFERENCE

The following related application is hereby incorporated by reference for its teachings:

U.S. patent application Ser. No. 08/057,797 to John R. Andrews, entitled "Method and Apparatus for the Positioning of Laser Diodes", and filed concurrently herewith.

BACKGROUND AND SUMMARY OF THE INVENTION

The present invention is directed to a method for producing a semiconductor laser device having a hybrid dual laser design that achieves inter-laser spacings as small as 20 μm. Such a device may be incorporated in numerous devices including optical disk readers or flying spot scanners (commonly referred to as raster output scanners (ROSs)). A flying spot scanner typically has a reflective multifaceted polygon mirror that is rotated about its central axis to repeatedly sweep one or more intensity modulated beams of light across a photosensitive recording medium in a linear or fast-scanning direction. Printers employing multiple intensity-modulated beams are referred to as multibeam or multispot printers. The dual or multispot lasers are considered to be an enabling technology for high speed printers operating at resolutions of about 600 spots per inch (spi). The present invention utilizes multiple asymmetric laser dies bonded p-side away from a heatsink to provide the multibeam output capability for a ROS. Furthermore, the small air space separating the two laser dies in the hybrid dual laser design provides thermal, electrical and optical isolation therebetween. To drive the lasers, electrical contact to the p-side thereof with a wire bond pad extending through the base from one side of the laser die.

Heretofore, the desirability of a multiple beam semiconductor laser has been recognized. However, because of thermal crosstalk, practical inter-laser spacings for the prior proposals are generally limited to spacings of at least 100 μm. Designs intended to achieve close spacing of the emitted laser beams are known, however, of which the following disclosures which may be relevant:

U.S. Pat. No. 4,901,325, patentee: Kato et al., issued: Feb. 13, 1990,

U.S. Pat. No. 4,870,652, patentee: Thornton, issued: Sep. 26, 1989,

U.S. Pat. No. 4,796,964, patentee: Connell et al., issued: Jan. 10, 1989,

U.S. Pat. No. 4,403,243, patentee: Hakamada, issued: Sep. 6, 1983,

The relevant portions of the foregoing patents, hereby incorporated by reference for their teaching, may be briefly summarized as follows:

U.S. Pat. No. 4,901,325 teaches a semiconductor laser device used in an optical disk device which utilizes a pair of semiconductor laser chips and a fixing device for fixing the laser chips so that the electrode surfaces are approximately parallel and opposite to each other. The fixing device comprises either a single-piece, U-shaped block or, alternatively, a pair of blocks, upon which the photodiodes are ultimately mounted. When a pair of blocks are used, a tooling system (see FIG. 9) is used to align and permanently affix the blocks to a base plate under the control of a vision system which enlarges and processes an image region centered on the active regions of the lasers affixed thereto.

U.S. Pat. No. 4,870,652, discloses a monolithic high density array of independently addressable semiconductor lasers. The lasers are further characterized as having emitters on closely spaced, 3-10 μm, centers, without displaying phase locking and with minimal crosstalk effects. The monolithic, independently addressable array is suitable for use with high speed laser printers, laser disk technology, and fiber optic communication.

U.S. Pat. No. 4,796,964 describes a method for using a multiple emitter solid state semiconductor laser in a raster output scanner. The overlapping beams are sequenced in ON/OFF operation to avoid any inter-beam interference in a manner that assures that only one laser beam will be on at any given time. Hence, nonuniformity caused by optical interference of overlapping beams is prevented without the need for further modification of the optical properties of the beams (e.g., polarization and wavelength).

U.S. Pat. No. 4,403,243 teaches a laser apparatus including support and soldering means for a light transmitting member which is affixed so as to allow transmission of an emitted laser beam generated within the apparatus by a semiconductor laser. The light transmitting member, by soldering, becomes hermetically sealed to a support member, thereby completely encapsulating the laser source.

In accordance with the present invention, there is provided a method of fabricating a multiple beam semiconductor laser having first and second semiconductor laser dies affixed to supporting heatsinks thereon. The method comprises the steps of laminating facing sides of the heatsinks on opposite sides of an intermediate material layer to form a sandwich, bonding the sandwich to a base, removing the intermediate material layer without disturbing the relative positions of the heatsinks, and permanently affixing the first and second semiconductor laser dies on facing sides of the heatsinks.

In accordance with another aspect of the present invention, there is provided a method of fabricating a multiple beam semiconductor laser. The method comprises the steps of forming a laminate including a layer of spacer material and a first heat sink, bonding the laminate to a base, placing a second heatsink in an abutting relationship with said base and the intermediate material of said laminate, bonding the second heatsink to a base, removing the spacer material layer from the laminate so as to space opposed facing surfaces of the first heatsink and the second heatsink from one another, and affixing a first semiconductor laser die on the facing surface of the first heatsink and a second semiconductor die on the facing surface of the second heatsink.

In accordance with yet another aspect of the present invention, there is provided a method of fabricating a mounting system for a multiple beam semiconductor laser, wherein the mounting system includes a pair of heatsinks located on a common base. The method includes the steps of laminating the heatsinks on opposite sides of an intermediate material layer to form a sandwich so that facing surfaces of the heatsinks are generally parallel and spaced apart by a predetermined distance, bonding the sandwich to a base, and removing the intermediate material layer without disturbing the relative positions of the heatsinks.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
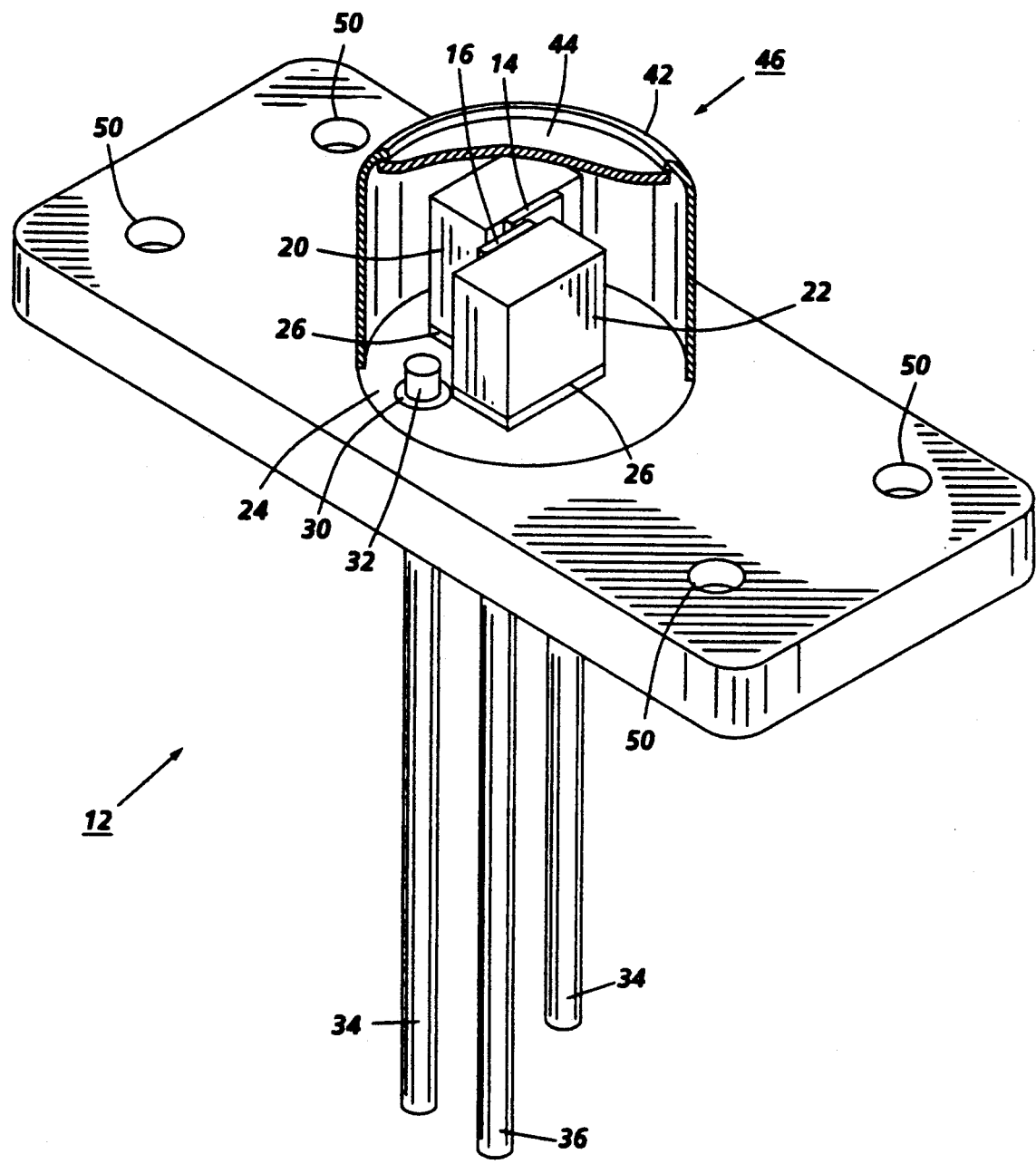
FIG. 1 is a perspective, cutaway view illustrating the hybrid semiconductor laser design produced with the present invention.

For a general understanding of the method of assembling the hybrid, multiple-beam, semiconductor laser of the present invention, reference is made to the drawings. In the drawings, like reference numerals have been used throughout to designate identical elements. FIG. 1 shows a cutaway view of the hybrid semiconductor laser as it would appear fully assembled.

More specifically, FIG. 1 illustrates a multibeam semiconductor laser preferably formed using a novel method which will be described hereafter. Multibeam laser 12 generally includes a pair of semiconductor laser devices or dies, 14 and 16, which are permanently affixed on the surfaces of heatsinks 20 and 22, opposed from one another, hereinafter referred to as facing surfaces. The heatsinks are also rigidly affixed to a circular base plate 24 by solder pads 26. Base plate 24 includes a series of insulating feed-throughs, 30, which allow terminals 32 to provide power to the laser dies from external sources connected to leads 34. In addition, ground lead 36 is permanently connected to the underside of electrically conductive base plate 24, preferably by soldering or brazing, to provide electrical contact thereto, establishing an electrical grounding path to the laser dies via the base plate and heatsinks. Once the previously described interior elements are assembled, cap 42, including a transparent window 44, is placed over the interior elements and sealed to the base plate to encapsulate the multibeam laser device and complete laser assembly 46. Assembly 46 may then be affixed to rigid support member 48 which not only protects the laser assembly, but also provides a plurality of mounting holes which may be used to accurately position the laser assembly and support to a mounting structure (not shown) by screws or similar fastening mechanisms (not shown).

The accurate placement of heatsinks 20 and 22, relative to one another, is critical to obtaining the desired inter-beam spacing for multispot laser assembly 46. In actuality, inter-laser spacing of only a few microns could be achieved with the hybrid laser design described herein, and using the following assembly process. The critical factors are the tolerances in the spacing between the parallel, facing surfaces of the heatsinks, and the variation in thickness of the base semiconductor wafer used to manufacture the laser dies. Both of these tolerances will determine the separation of the lasers ($\Delta X$ in FIG. 4), and the accuracy with which $\Delta X$ can be controlled. An automated assembly operation can be used to position the two heatsinks on the base plate, however, this typically can only achieve a nominal accuracy of approximately $\pm 5$ $\mu$m. However, it is preferable to have a heatsink positioning method that does not rely on accurate relative placement of the heatsinks.

Another critical factor in controlling the minimum inter-laser spacing, is the accuracy with which the laser substrate wafers can be thinned to a predetermined thickness. In general, for mechanical stability and ease of handling, a typical final substrate thickness, following thinning by a chemo-mechanical polishing process, is approximately 70 $\mu$m with a range or error of about $\pm 10$ $\mu$m. However, the use of modern thickness measuring equipment, or profilometers, and optical polishing for the wafer thinning process, is believed to enable the achievement of thickness variation control to an accuracy of about $\pm 1$ $\mu$m.

Figure 2:
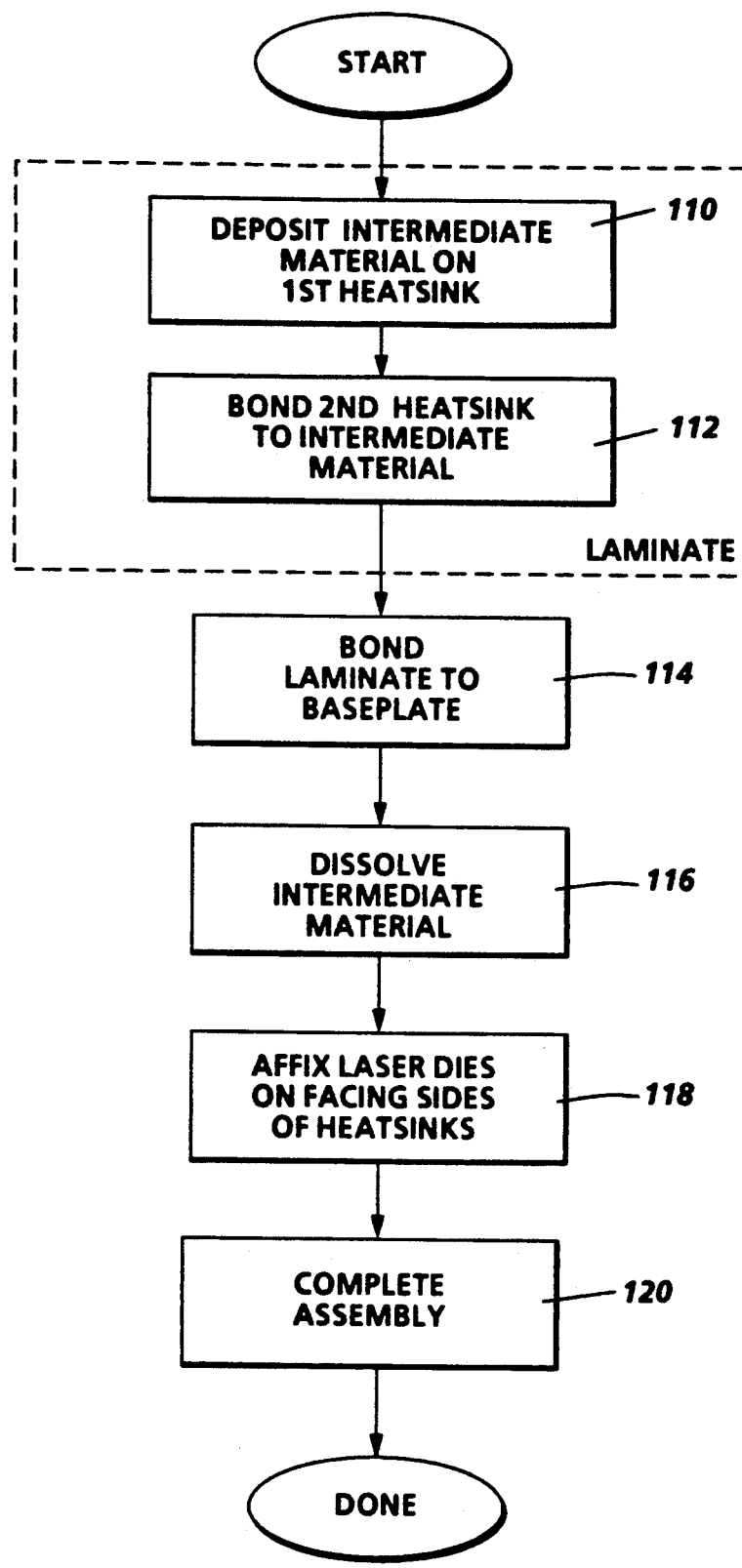
FIG. 2 is a flowchart illustrating the basic processing steps employed in the present invention.
Figure 3:
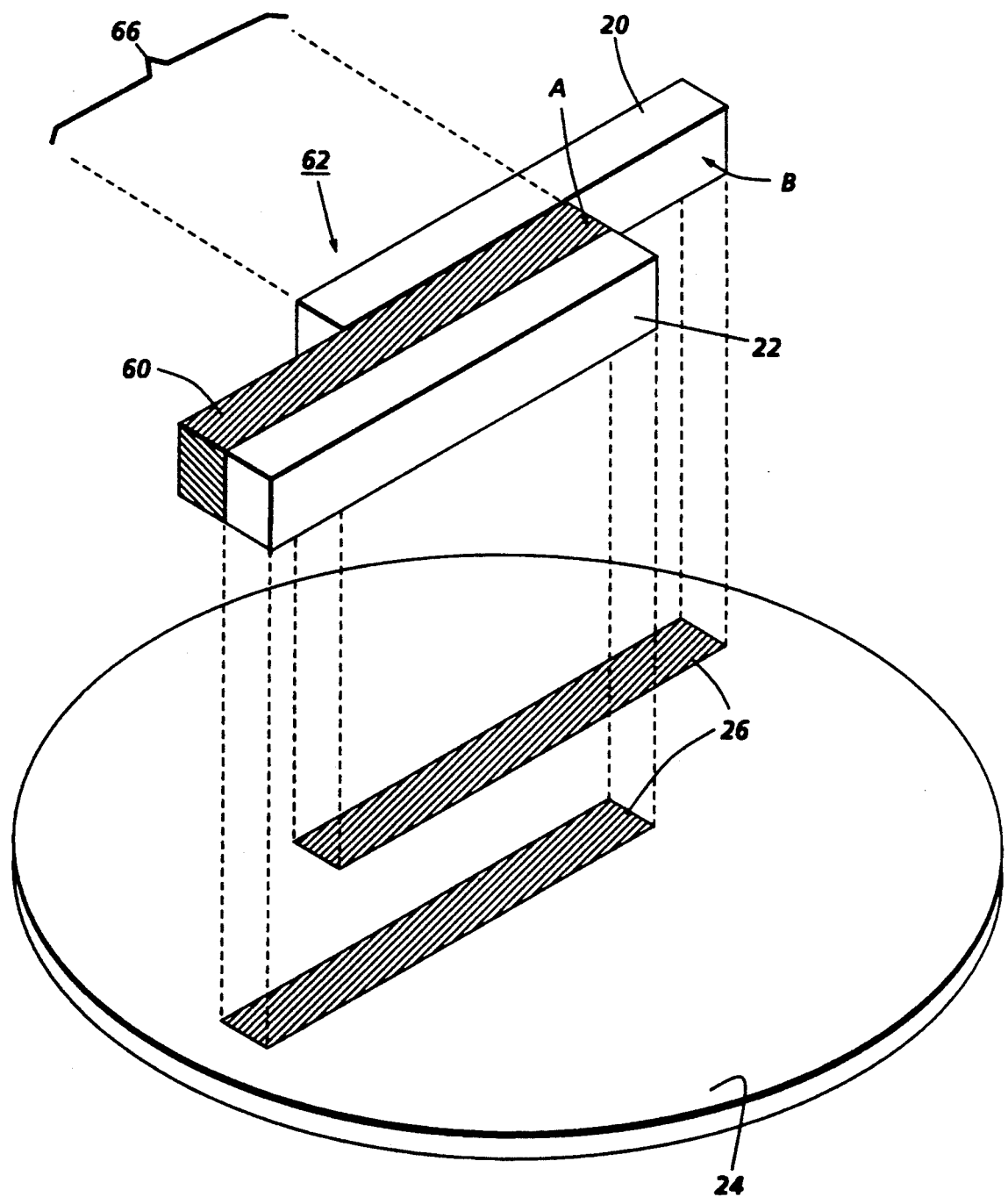
FIG. 3 is an perspective view of the method of assembling the semiconductor laser in accordance with the process represented in FIG. 2.
Figure 4:
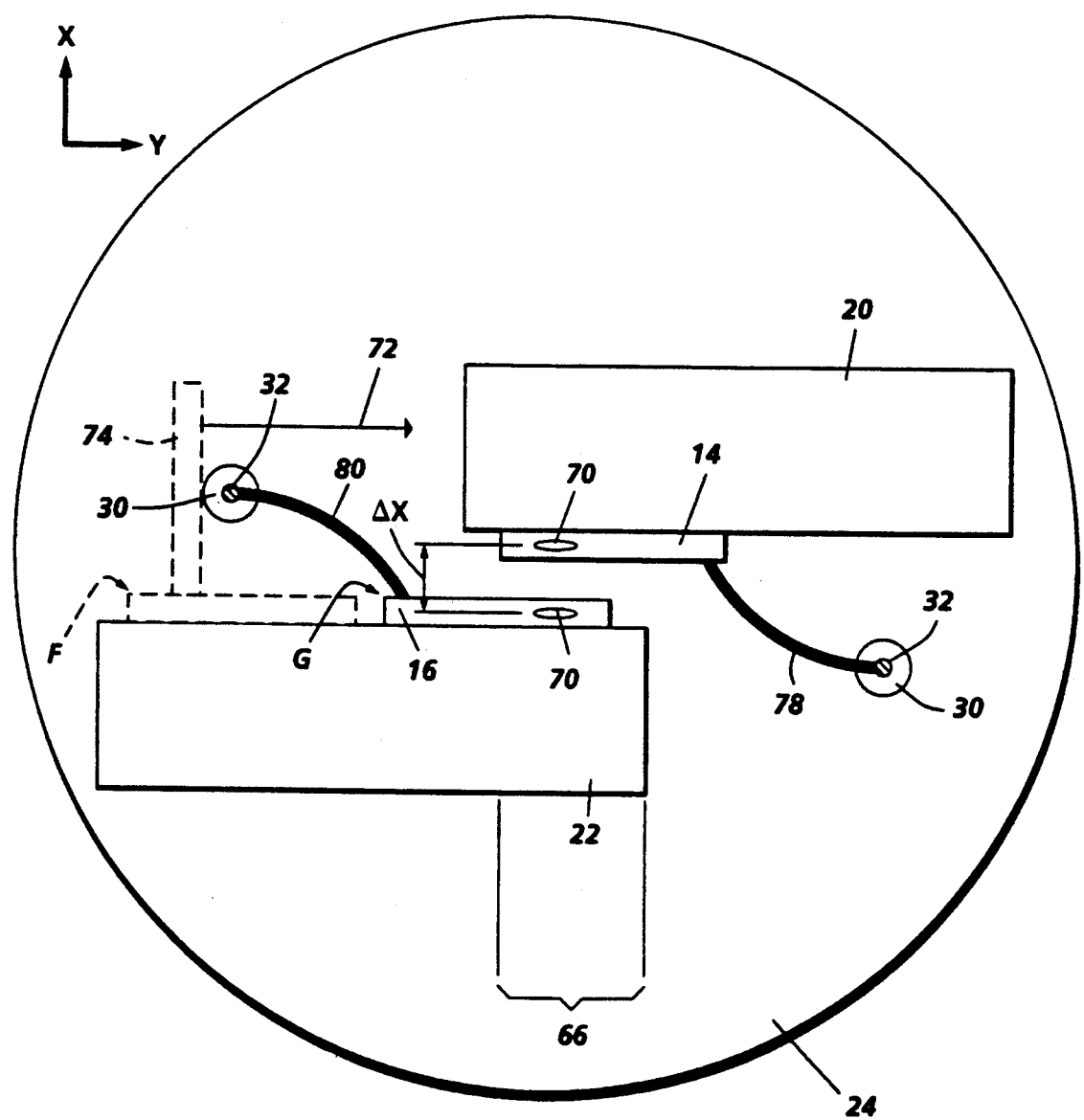
FIG. 4 is a schematic illustration representing the final assembly steps of the semiconductor laser depicted in FIG. 1.

As represented by the steps shown in FIG. 2 and the partial assemblies illustrated in FIGS. 3 and 4, a method of achieving the desired positioning of heatsinks 20 and 22 would be to laminate the heatsinks on opposite sides of an etchable or dissolvable, intermediate spacer material 60, for which the dimensions may be accurately controlled. Referring to FIG. 2, the lamination process may include the step of depositing the intermediate material on a first heatsink, step 110, and then bonding the second heatsink to the opposite side of the intermediate spacer material, step 112. As represented in FIG. 3, the laminate or sandwich, 62, could then be soldered, brazed or otherwise bonded so that the heatsinks are affixed to base 24. The spacer material is then etched or dissolved away leaving the two properly spaced heatsinks permanently affixed in the desired relative alignment.

For example, a first gold or nickel plated heatsink, 22 could be electroplated to produce a copper spacer 60 on facing side A. Next, facing side B of the second gold or nickel plated heatsink, 20, could be bonded to the copper spacer using a high melting point solder to complete the laminate. Preferably, the solder would have a melting point greater than about 300° C. and could be an alloy such as gold-tin, lead-tin, or lead-silver.

Heatsinks 20 and 22 are intended to have parallel surfaces, A and B, across an air gap of approximately 200 $\mu$m. The parallel surfaces are also displaced laterally so that there is not only a region where the heatsink surfaces overlap one another, region 66, but outlying regions where facing surfaces A and B are exposed for mechanical access. Furthermore, alternative spacer materials could be used in place of the electroplated copper, including spin coated organic polymers and vacuum evaporated organic, metallic, or oxide materials.

Assuming a reasonable electroplating thickness accuracy of approximately one percent, a spacing accuracy of about $\pm 1.0$ $\mu$m is expected for a nominal heatsink spacing of approximately 200 $\mu$m. The heatsinks are then bonded to base 24, step 114, by placing the laminate over solder pads 26, and compressing the laminate against the base while applying heat sufficient to melt the solder pads. Preferably, the laminate would be bonded to the base using solder having an intermediate melting point. For example, a lead-indium solder having high lead content results in a solder melting point in the range of approximately 230° C. to 280° C.

In an alternative embodiment, the spacer material might be deposited on the first heatsink, as in step 110, and subsequently, the spacer and first heatsink may be bonded to the base plate 24. The second heatsink could then be placed on the base plate in an abutting relationship to the spacer material and bonded to the base plate using a lower melting point solder or equivalent joining method. Such an alternative is believed to achieve substantially the same accuracy in alignment and spacing of the parallel heatsinks as the three-part laminate previously described.

Subsequent to cooling the assembled base plate with heatsinks 20 and 22 thereon, the copper spacer material, 60, would be chemically etched away to leave the heatsinks positioned as desired, step 116. More specifically, if an electroplated copper spacer is used between the two laser heatsinks, it can be removed with an ammoniacal copper etchant which is commonly used in printed circuit board processing. These etchants can be selective to copper and leave the bond of the heatsinks to the base unaffected. If required, subsequent diamond machining of the uppermost heatsink surfaces, the sides opposite those affixed to the base plate, would insure that the uppermost surfaces are coplanar. This would further insure that the laser emitting apertures 70 will be affixed so as to be coplanar with the respective upper heatsink surfaces and will lie in the same plane.

The next step, step 118, accomplishes the positioning and affixing of the laser dies on the facing surfaces of the respective heatsinks, where the laser dies have emitting stripe 70 along one side thereof. Referring now to FIG. 4, which illustrates step 118, the assembly operation consists of placing a laser die on the facing surface of the heatsink, with the substrate side of the laser die contacting the heatsink, within the exposed region lying outside of overlap region 66, and sliding it between the parallel surface of the other heatsink within the overlap region, in the direction indicated by arrow 72. The operations of step 118 are further illustrated in FIG. 4 where the original position of the laser die is shown in phantom at location F, where it is supported by a chuck of a pick-and-place robot, 74.

Once the laser die is positioned at location G, the die is soldered in place to permanently attach it to the surface of heatsink 22. Preferably, laser dies 14 and 16 would be positioned and affixed to heatsinks 20 and 22, respectively, using a low temperature solder such as pure indium or a high indium content indium-lead alloy melting at less than about 210° C. The bonding of the two laser dies could be done in most instances during one operation using the same solder for both lasers. Alternatively, it is also possible to use a low temperature indium-lead solder for the first laser bond and pure indium for the second laser bond if that proves convenient. It is further emphasized that the sequential bonding processes described with respect to steps 112, 114, and 118 above require progressively lower temperature solders to be used in the bond joints so that previously made bonds do not soften and deform when a new bond is made. Such sequential soldering and brazing operations are well known, and a wide range of pure metals and alloys may be appropriate for the three tier bonding sequence described.

As a result of the limited overlap of the heatsinks a portion of the top surface of both laser dies 14 and 16 are exposed in the non-overlapping regions on the outermost ends of the heatsinks. The non-overlapping ends of the laser dies are therefore available as a wire bonding pads to enable electrical contact to the p side of the laser. More specifically, at step 120 of FIG. 2, the assembly is completed by wirebonding electrical conductors 78 and 80 between their respective terminals and laser dies. Once the wirebonds complete the connection to terminals 32, the laser dies may then be powered by external power sources (not shown) connected to leads 34 and 36 of FIG. 1.

To further assure accurate placement of laser die 16 on the surface of heatsink 22, it may be possible to employ the alignment mechanisms disclosed and claimed in copending patent application Ser. No. 08/057,797, hereby incorporated by reference for its teachings. In general, because the alignment mechanisms also define the location of the laser emitter stripe, they may be used to accurately position the laser die on the surface of the heatsink as described in the copending application. Alternatively, a commonly available vision system may be employed to control the placement of the dies in the y-direction. Moreover, while the y-direction placement of the laser dies with respect to one another is important it can be corrected using a delay between the times that the laser are energized. Thus, the critical dimension that is most accurately controlled by the previously described process is the separation of the laser emitters, 70, in the x-direction, referred to as $\Delta X$ in FIG. 4.

In recapitulation, the present invention is a method for fabricating a multiple beam semiconductor laser, wherein the laser includes first and second semiconductor laser dies respectively affixed to a pair of supporting heatsinks. The method utilizes a lamination operation to accurately position the supporting heatsinks relative to one another yet on opposite sides of an intermediate spacer. After permanently affixing the heatsinks to a base plate, the intermediate spacer is dissolved or otherwise removed to expose the mounting surfaces for the laser dies. The method not only enables the accurate placement of the heatsinks relative to one another so as to reduce the positional error, but also eliminates the need for a multiple-step alignment operations commonly employed to produce multiple diode laser devices.

It is, therefore, apparent that there has been provided, in accordance with the present invention, a method for accurately positioning at least two laser dies on the opposing or facing surfaces of two heatsinks to produce a closely-spaced, multiple diode laser. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. A method of fabricating a multiple beam semiconductor laser comprising the steps of:

forming a laminate including a layer of intermediate material interposed between a first heat sink and a second heat sink;

bonding the laminate to a base;

removing the intermediate material layer from the laminate so as to space opposed facing surfaces of the first heatsink and the second heatsink from one another; and affixing a first semiconductor laser die on the facing surface of the first heatsink and a second semiconductor die on the facing surface of the second heatsink.

2. The method of claim 1, wherein the forming step comprises the steps of:

depositing the layer of intermediate material on the facing side of the first heatsink; and securing the facing surface of the second heatsink to the opposed surface of the layer of intermediate material.

3. The method of claim 2, wherein the forming step further comprises the step of grinding the surface of the laminate opposed from the base to produce a substantially planar surface for aligning the edges of the first and second semiconductor laser dies, thereby assuring that the semiconductor laser dies are coplanar.

4. The method of claim 1, wherein the bonding step comprises the steps of:

placing the laminate in contact with a generally planar surface of the base;

attaching the laminate and the base to one another by heating the laminate and the base, in the presence of an alloy, to a temperature greater than the alloy melting point; and cooling the laminate, base and alloy below the melting point so as to cause the alloy to join the laminate to the base.

5. The method of claim 1, wherein the removing step includes the step of chemically dissolving the layer of intermediate material.

6. The method of claim 1, wherein the affixing step comprises the steps of:

placing the first laser die on the facing surface of the first heatsink, in a region wherein the facing surface of the first heatsink and the facing surface of the second heatsink are non-overlapping;

moving the first laser die to a predetermined location on the first heatsink, the predetermined location being in a region where the facing surface of the first heatsink overlaps the facing surface of the second heatsink;

attaching the first laser die to the facing surface of the first heatsink;

placing the second laser die on the facing surface of the second heatsink, in a region wherein the facing surface of the first heatsink and the facing surface of the second heatsink are non-overlapping;

moving the second laser die to a predetermined location on the second heatsink, the predetermined location being in a region where the facing surface of the first heatsink overlaps the facing surface of the second heatsink; and attaching the second laser die to the facing surface of the second heatsink.

7. A method of fabricating a multiple beam semiconductor laser comprising the steps of:

forming a laminate including a layer of spacer material and a first heat sink;

bonding the laminate to a base;

placing a second heatsink in an abutting relationship with said base and the intermediate material of said laminate;

bonding the second heatsink to a base;

removing the spacer material layer from the laminate so as to space opposed facing surfaces of the first heatsink and the second heatsink from one another; and affixing a first semiconductor laser die on the facing surface of the first heatsink and a second semiconductor die on the facing surface of the second heatsink.

8. The method of claim 7, wherein the forming step comprises the step of depositing the layer of spacer material on the facing side of the first heatsink.

9. A method of fabricating a mounting system for a multiple beam semiconductor laser, comprising the steps of:

forming a laminate including a layer of intermediate material interposed between a first heat sink and a second heat sink with opposed facing surfaces of the first heatsink and the second heatsink being spaced apart and substantially parallel to one another;

bonding the laminate to a base; and removing the intermediate material layer without disturbing the relative positions of the heatsinks.

10. The method of claim 9, wherein the forming step comprises the steps of:

depositing the layer of intermediate material on the facing side of the first heatsink; and securing the facing surface of the second heatsink to the opposed surface of the layer of intermediate material.

11. The method of claim 10, wherein the forming step further comprises the step of grinding the surface of the laminate opposed from the base to produce a substantially planar surface for aligning the edges of the first and second semiconductor laser dies, thereby assuring that the semiconductor laser dies are coplanar.

12. The method of claim 9, wherein the bonding step comprises the steps of:

placing the laminate in contact with a generally planar surface of the base;

attaching the laminate and the base to one another by heating the laminate and the base, in the presence of an alloy, to a temperature greater than the alloy melting point; and cooling the laminate, base and alloy below the melting point so as to cause the alloy to join the laminate to the base.

13. The method of claim 9, wherein the removing step includes the step of chemically dissolving the layer of intermediate material.

* * * * *